United States Patent
Bullied et al.

(10) Patent No.: US 9,545,664 B2
(45) Date of Patent: Jan. 17, 2017

(54) HIGH TEMPERATURE DIRECTIONALLY SOLIDIFIED AND SINGLE CRYSTAL DIE CASTING

(71) Applicant: UNITED TECHNOLOGIES CORPORATION, Hartford, CT (US)

(72) Inventors: Steven J. Bullied, Pomfret Center, CT (US); John Joseph Marcin, Marlborough, CT (US); Mario P. Bochiechio, Vernon, CT (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 14/220,915

(22) Filed: Mar. 20, 2014

(65) Prior Publication Data
US 2014/0205493 A1    Jul. 24, 2014

Related U.S. Application Data

(62) Division of application No. 13/341,549, filed on Dec. 30, 2011, now Pat. No. 8,714,235.

(51) Int. Cl.
*B22D 17/00* (2006.01)
*B22D 17/22* (2006.01)
(Continued)

(52) U.S. Cl.
CPC ............. *B22D 17/00* (2013.01); *B22C 9/06* (2013.01); *B22D 15/04* (2013.01); *B22D 17/22* (2013.01);
(Continued)

(58) Field of Classification Search
CPC ........... B22C 9/06; B22D 15/04; B22D 17/00; B22D 17/22; B22D 17/2218; B22D 27/04; B22D 27/045
(Continued)

(56) References Cited

U.S. PATENT DOCUMENTS 3,544,355 A * 12/1970 Ott ..................... B22D 17/2007
                                                                    118/317
3,760,864 A *  9/1973 Kirby, Jr. et al. ..... B22D 27/04
                                                                    164/126
(Continued)

FOREIGN PATENT DOCUMENTS

JP        62-224468 A  * 10/1987 ............. B22D 17/20

OTHER PUBLICATIONS

Roger C. Reed, Kenneth A. Green, Pierre Caron, Timothy P. Gabb, Michael G. Fahrmann, Eric S. Huron and Shiela A. Woodard, Grain Selection During Solidification in Spiral Grain Selector, Superalloys 2008, TNS (The Minerals, Metals & Materials Society), 2008.

*Primary Examiner* — Kevin P Kerns
(74) *Attorney, Agent, or Firm* — Kinney & Lange, P.A.

(57) ABSTRACT

A high-temperature die casting die includes a first die plate with a first recess and a second die plate with a second recess, the first and second recesses defining a main part cavity and gating. A grain selector is in fluid communication with the main cavity, and an in situ zone refining apparatus is adapted to apply a localized thermal gradient to at least one of the first and second die plates. The localized thermal gradient and the at least one die plate are movable relative to each other so as to apply the localized thermal gradient along a first direction extending from the grain selector longitudinally across the main part cavity.

11 Claims, 5 Drawing Sheets

(51) Int. Cl.
  *B22D 15/04*    (2006.01)
  *B22D 27/04*    (2006.01)
  *B22C 9/06*    (2006.01)
  *C30B 11/14*    (2006.01)

(52) U.S. Cl.
  CPC ......... *B22D 17/2218* (2013.01); *B22D 27/045* (2013.01); *C30B 11/14* (2013.01)

(58) Field of Classification Search
  USPC ................. 164/284, 303, 338.1, 348, 113
  See application file for complete search history.

(56) References Cited

U.S. PATENT DOCUMENTS

| | | | |
|---|---|---|---|
| 4,453,588 A | 6/1984 | Goulette et al. | |
| 5,259,436 A * | 11/1993 | Yun et al. | B22D 17/14 164/113 |
| 5,316,070 A | 5/1994 | Rogers et al. | |
| 5,875,830 A * | 3/1999 | Singer et al. | B22D 19/00 164/132 |
| 6,648,054 B2 | 11/2003 | Kuramasu et al. | |
| 7,198,265 B2 | 4/2007 | Chelvayohan et al. | |
| 7,204,294 B2 | 4/2007 | Jennings et al. | |
| 7,584,778 B2 | 9/2009 | Song et al. | |
| 8,714,235 B2 * | 5/2014 | Bullied et al. | 164/303 |
| 2003/0037900 A1 * | 2/2003 | Winterbottom et al. | B22D 17/007 164/113 |
| 2005/0092457 A1 * | 5/2005 | Park | B22D 27/04 164/348 |
| 2006/0063870 A1 | 3/2006 | Chang et al. | |
| 2007/0137827 A1 | 6/2007 | Vogt et al. | |
| 2010/0071865 A1 * | 3/2010 | Shibata et al. | B22D 17/06 164/119 |
| 2012/0110813 A1 * | 5/2012 | Bullied et al. | B22D 17/10 29/423 |

* cited by examiner

HIGH TEMPERATURE DIRECTIONALLY SOLIDIFIED AND SINGLE CRYSTAL DIE CASTING

CROSS-REFERENCE TO RELATED APPLICATION(S)

This application claims priority as a divisional application under 35 U.S.C. §121 of earlier filed U.S. patent application Ser. No. 13/341,549 entitled "HIGH TEMPERATURE DIRECTIONALLY SOLIDIFIED AND SINGLE CRYSTAL DIE CASTING" and filed on Dec. 30, 2011, which is hereby incorporated by reference.

BACKGROUND

The invention relates generally to systems and methods for die casting, and more specifically to apparatus and methods for high-temperature directionally solidified and single-crystal die casting.

Certain metals and alloys have previously responded better to die casting while others are better cast using investment processes. Lower melting temperatures of aluminum-based and magnesium based alloys, for example, as well as favorable solidification pathways permitted the use of temperature resistant injection molds whereby the molten metal is solidified with a minimum of shrinkage or defects. Alloys with higher melting temperatures such as iron-based, titanium-based, nickel-based, and cobalt-based alloys or superalloys have traditionally been investment cast in ceramic molds to attain precise castings with little interaction of the molten metal with the mold material.

Investment casting can be a complex, expensive, and time-consuming process full of waste and is prone to error. High-temperature die casting is also difficult, given the relatively narrow available superheating range and the resulting tendency toward defects, shrinkage, and waste. In addition, traditional die casting results in equiax solidification from the die surface toward the center of the casting. This greatly complicates more specialized die castings requiring careful temperature control, such as single crystal (SX) castings and castings with columnar grain orientations formed via directional solidification (DS).

SUMMARY

A high-temperature die casting apparatus comprises a die casting die and a chiller. The die casting die has a recess for solidifying molten metal into a casting. The recess includes gating in fluid communication with the main cavity. The chiller is adaptable to directionally apply a localized thermal gradient from a first end to a second end of the casting.

A method of die casting a metal alloy having a melting temperature of at least 1500° F. (815° C.) comprises injecting molten alloy into gating and a main part cavity of a die casting die. The molten alloy is solidified in the main part cavity to form a casting. A localized thermal gradient is directionally applied to the casting.

DETAILED DESCRIPTION

Figure 1:
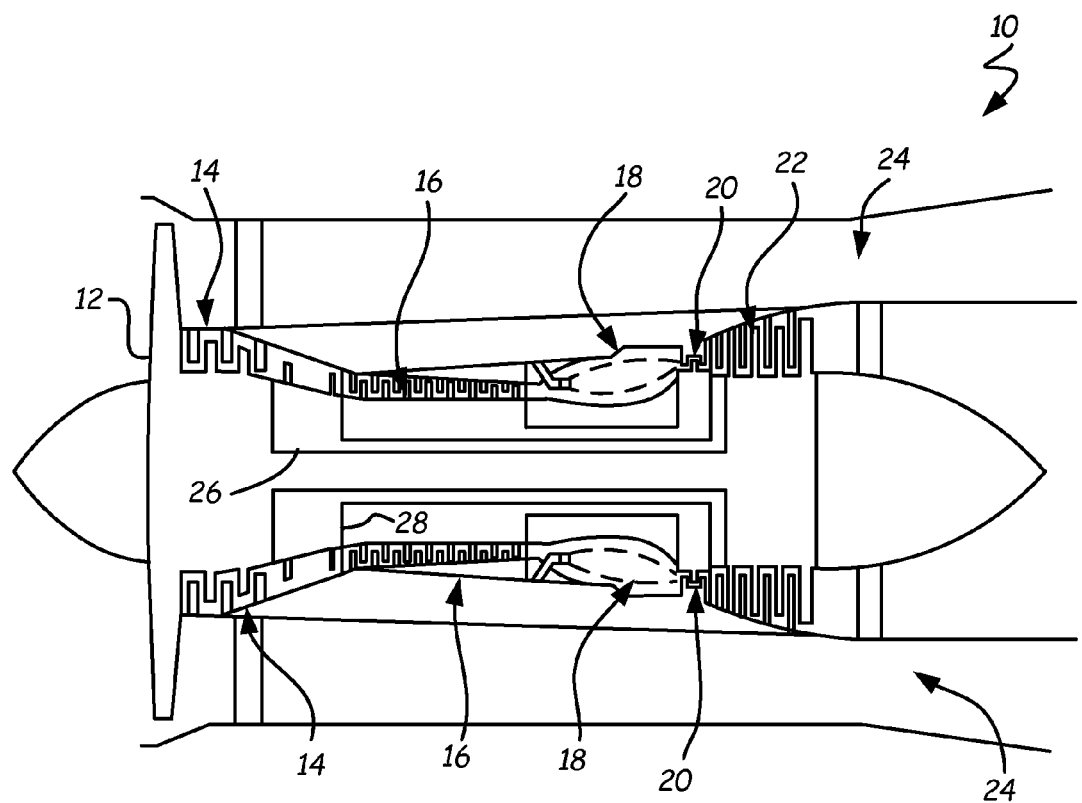
FIG. 1 schematically depicts a cross-section of a gas turbine engine.

FIG. 1 includes engine 10, fan section 12, low-pressure compressor section 14, high-pressure compressor section 16, combustor section 18, high-pressure turbine section 20, low-pressure turbine section 22, bypass 24, low-pressure shaft 26, and high-pressure shaft 28. FIG. 1 schematically depicts an axial cross-section of example turbofan engine 10. A portion of atmospheric air pulled in by rotation of fan section 12 is directed toward low-pressure compressor section 14, while the remainder is directed through bypass section 24. Air entering low-pressure compressor section 14 is further compressed in high-pressure compressor section 16 before fuel is added and the mixture ignited in combustor section 18. Respective high-pressure (HP) and low-pressure (LP) turbines 20, 22 capture a portion of the energy from expanding combustion products to rotate respective shafts 28, 26. Thrust is generated by the force of the air drawn into fan section 12 (driven by low-pressure shaft 26) and pushed through bypass section 24, and by the force of exhaust gases exiting low-pressure turbine section 22.

Figure 2:
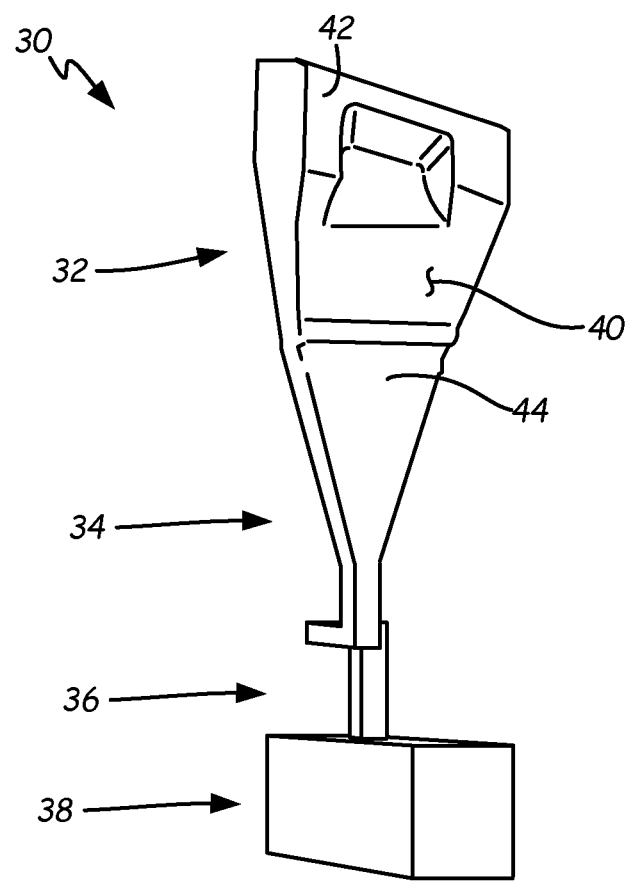
FIG. 2 depicts an example die casting of a turbine blade.

FIG. 2 shows die casting 30, main casting section 32, gating section 34, grain selector section 36, starter block section 38, airfoil section 40, tip section 42, and root section 44. In this illustrative example, main casting 32 is a precursor to turbine blade for HP turbine section 20 or LP turbine section 22 shown in FIG. 1. Gating section 34 includes grain selector section 36 and starter block section 38. When casting 30 is first formed, gating section 34 may also include additional gating material attached to the starter block. As a turbine blade, main casting section 32 includes airfoil section 40 disposed between tip section 42 (proximate gating section 34) and root section 44. It will be recognized that once gating section 34 is removed, main casting 32 can be processed (machining, twisting, etc.) into the final blade shape.

Die casting 30 can be cast longitudinally as a single crystal to anisotropically strengthen casting 30, for example, in a spanwise direction (generally bottom to top as shown in FIG. 2). Closely aligning specific primary and secondary crystallographic orientations with the spanwise dimension of the blade increases resistance to longitudinal stresses characteristic of centrifugal operation of a turbine rotor in engine 10. By way of example, effects of crystallographic orientation on single crystal turbine blades are discussed in commonly assigned U.S. Pat. No. 4,605,452, incorporated herein by reference in its entirety.

In single crystal form, die casting 30 can also increase creep resistance as compared to other equiax and columnar grain castings because eliminating grain boundaries removes a frequent creep mechanism. In addition, grain boundary strengtheners (e.g., carbon, boron, or silicon) typically used in polycrystalline superalloys can be omitted, effectively raising the alloy melting point and further improving creep resistance at higher hot section temperatures. Creep resistance helps the blade withstand the combination of high operational temperatures and longitudinal stresses which can accelerate failure of traditionally cast or forged turbine blades.

Single-crystal die casting 30 can be produced according to the high-temperature die casting processes and apparatus described below. Further, alternative directionally solidified embodiments of casting 30 have columnar grains and grain boundaries axially aligned generally in the direction of solidification. Aligning grain boundaries in this manner also anisotropically improves strength and resilience over traditional equiax die castings. Such castings can be formed by optionally omitting the grain selector or seed crystal from the die casting apparatus.

The alloy used for casting 30 can be any high temperature die casting alloy, including but not limited to alloys designed specifically adapted to high temperature directional or single crystal casting. Other conventional SX alloy compositions can also be utilized in this process. In addition, non-SX compositions with grain boundary strengthening elements can be used to die cast DS alloys with columnar grains. Specifically for directionally solidified alloys, one approach to improve castability is to adjust the amount of grain boundary strengtheners in order to modify the γ' or γ" chemistry which helps prevent cracking during rapid solidification. Depending on the alloy being cast, strengtheners can include carbon, boron, zirconium and/or niobium. For example, boundary strengtheners can be adjusted by increasing or decreasing the aluminum, niobium, tantalum, and/or titanium composition. Additionally, reactive elements such as, but not limited to, yttrium and lanthanum can be added to the alloy and more readily retained due to the quick solidification process and lack of ceramic materials present in the die casting process. Other elements may also be added before alloy injection to provide a more stable and robust high temperature casting.

Generally, high-temperature die casting alloys have melting temperatures of at least about 1500° F. (about 815° C.). In certain embodiments, the alloy is a superalloy having a melting temperature of at least about 2000° F. (about 1090° C.). In certain of those embodiments, the superalloy has a melting temperature of at least about 2300° F. (about 1250° C.). In certain embodiments, the alloy has a predominant element (i.e., having a weight percentage more than that of any other constituent element) of one of titanium, iron, nickel, or cobalt. In certain of those embodiments, the predominant element is either nickel or cobalt. In some embodiments, the weight percentage of the predominant element does not exceed 50%. In other of those embodiments, the weight percentage of the predominant element equals or exceeds 50%.

One example nickel-based superalloy usable for die casting 30 is sold commercially as Inconel 718 Plus®, the equivalent of which is available from multiple commercial suppliers. Inconel 718 Plus® and its equivalents are characterized by a melting temperature of about 2420° F. (about 1330° C.), nickel content ranging between about 50.1 wt % and about 55.0 wt %, chromium content ranging from about 17.0 wt % to about 21.0 wt %, as well as substantial quantities of molybdenum, titanium, niobium, and iron. With its temperature and creep resistance, Inconel 718 Plus® is suitable for use in some of the highest temperature regions of gas turbines, including critical components of the combustor and the high-pressure turbine sections. As mentioned above, other alloys and superalloys specifically developed or modified to take advantage of the high-temperature die casting process may also be used.

While shown as a high-pressure turbine blade, it will be apparent that casting 30 can be directed more generally to airfoils (i.e. blades and vanes) in HP or LP turbines 20, 22, and thus may or may not include additional tip or root features such as seals. It will also be apparent that casting 30 and their corresponding casting dies (examples shown below) can alternatively or additionally adapted where applicable to airfoils or other cast components other than turbine sections 20, 22. Turbofan engine 10 can alternatively have a single spool or include more than two spools. Engine 10 can alternatively be another gas turbine engine such as an industrial gas turbine (IGT), turboprop, or turboshaft. Single-crystal die casting 30 and the process described below can be further adapted to take advantage of the favorable properties of single-crystal and columnar grain castings useful in many other non-aerospace fields.

Figure 3A:
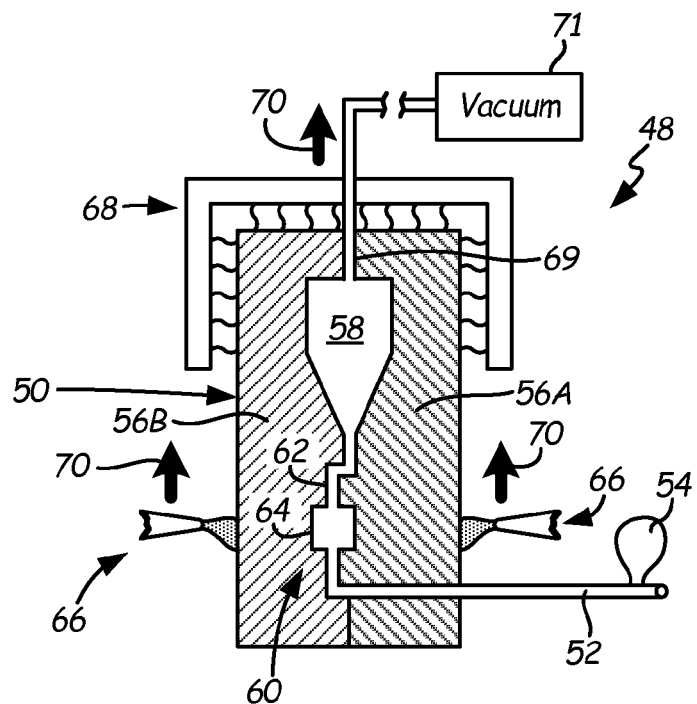
FIG. 3A shows a high-temperature die casting apparatus with a grain selector.
Figure 3B:
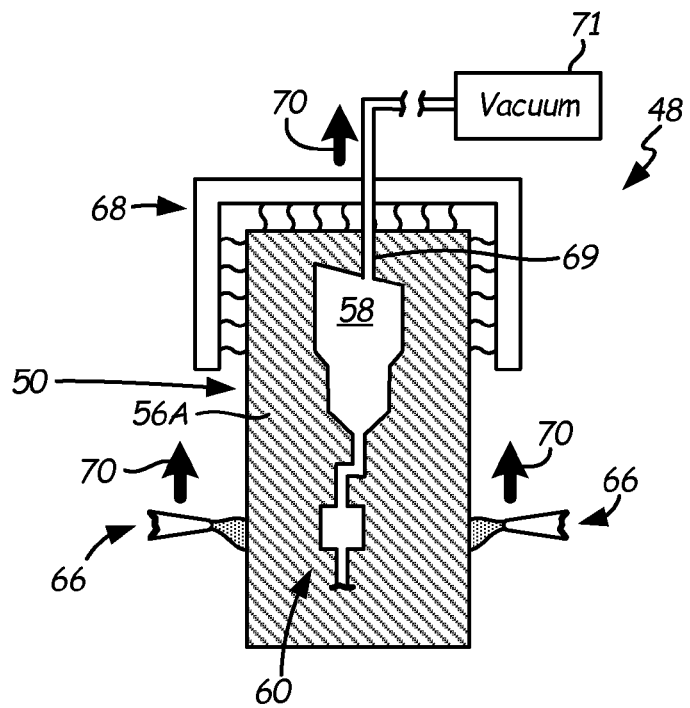
FIG. 3B is a die plate from FIG. 3A.

FIG. 3A shows casting machine 48 with casting die 50, pressure chamber 52, shot sleeve 54, cover die plate 56A, ejector die plate 56B, main cavity 58, gating 60, grain selector cavity 62, starter block cavity 64, chillers 66, heat source 68, vacuum port 69, thermal gradient direction 70, and vacuum source 71. FIG. 3B shows interior details of die 50 with respect to die plate 56A.

Die casting die 50 is removably mounted to high-temperature die casting machine 48. Pressure chamber 52 is configured to rapidly inject molten metal (not shown) from shot sleeve 54. Die casting die 50 has two parts, stationary cover plate 56A and movable ejector plate 56B. In this example, molten metal enters first and second recesses respectively formed in stationary plate 56A and ejector plate 56B. The recesses together define main part cavity 58. Die casting machine 48 includes other components for mounting and supporting die 50 but these have been omitted in favor of showing elements more helpful to understanding the invention.

The geometry of main part cavity 58 corresponds to the desired shape of casting 30 (shown in FIG. 2). In practice the geometry of cavity 58 varies slightly from the intended shape of casting 30 to facilitate solidification, shrinkage, and ejection from die 50. The geometry of casting 30 can itself vary to a degree in comparison to the final part shape. For example, it is known in die casting to generally avoid sharp corners and taper angles. Casting 30 can also be processed after solidification into the form of a turbine blade or other final shape via machining, twisting, or other operations. Thus accommodations can be made to account for certain issues specific to die casting without departing from the scope and spirit of the invention.

Die 50 has gating 60 which also includes grain selector cavity 62 and starting block cavity 64, all of which are in fluid communication for directing molten metal into main cavity 58. Die casting apparatus 48 also includes chillers 66 and heat source(s) 68, which can be used alone or together to control solidification of molten metal into die casting 30. In certain embodiments, this is achieved by applying a localized thermal gradient through thermally conductive die plates 56A, 56B, and moved the gradient in longitudinal direction 70 relative to die 50. In certain of those embodiments, chiller 66 and heat source 68 are specifically adapted to induce and maintain the thermal gradient in the localized portion of main cavity 58.

It will be recognized that heat source 68 can be integral to or separate from the rest of die apparatus 48. Heat source 68 can be a furnace, resistance heater, inductive heater, recirculating liquid metal or other suitable device to maintain the elevated temperature above the solidification front as it proceeds in direction 70. Similarly, chiller 66 can be configured to direct a water and/or lubricant coolant at exterior surface(s) of die 50. In one example, chiller 66 sprays a water-based coolant containing a polymer additive. Alternatively, chiller 66 can be integrated into die casting apparatus 48 or die 50 including one or more pipes configured to circulate coolant therethrough. Coolants can include those described in the preceding paragraph. More generally, depending on the structure of casting machine 48 and the layout of other nearby processing equipment, it will be recognized that one or more of die 50, chiller 66, and heat source 68 can be moved, activated, or deactivated in any manner relative to one another so as to control effective longitudinal movement of a localized thermal gradient along direction 70.

In addition, a combination of devices that enhance insulation and chilling can also be employed. This includes in-situ insulation of die 50 and/or thermally conductive pathways between chillers 66 and cavity 58. For example, die 50 may be insulated to retain molten metal above the solidification front using ceramic, metal matrix, or ceramic matrix composites, as well as metals having lower thermal conductivity and higher refractory qualities. In addition, the thermally conductive pathway may include any suitable material that can withstand the high rate of heat transfer between chiller 66 and cavity 58, such as silicon carbide, as well as cobalt- or copper-based materials. Use of these or similar materials can be combined and configured in casting die 50 to facilitate rapid heat removal and maintain a localized thermal gradient along a very narrow region of die 50. This further improves die casting of higher temperature alloys, including those with melting temperatures of at least about 1500° F. (815° C.).

Regardless of their exact configuration, chiller 66 and heat source 68 are configured to lower the temperature in cavity 58 progressively in direction 70, first through in-gate 60 then, as appropriate for either a single crystal or columnar grain casting, through starter block 64, grain selector 62, and main cavity 58. In certain embodiments, the thermal gradient measures at least about 145° F. (about 70° C.). In certain of those embodiments, the gradient measures at least about 200° F. (about 110° C.). Due in part to high melting temperatures of certain alloys, the solidification range of these alloys when used in high-temperature die casting can be less than about 200° F. (about 110° C.) between the beginning of crystallization and final solidification. In certain embodiments, the range can be less than about 125° F. (about 70° C.). In certain of those embodiments, the range is on the order of about 55° to about 80° F. (about 30° to about 45° C.). Thus, a traditional die casting apparatus using many high-temperature alloys often results in very compressed solidification timing and frequent casting errors. Despite temperature restrictions, die casting apparatus 48, die 50, and associated casting processes enable relatively consistent formation of high-temperature single-crystal and columnar grain die castings.

Higher melting and casting temperatures often result in more vapors and induce formation of oxides in cavity 58 as compared to die casting of lower temperature alloys. Thus in certain embodiments, high temperature die casting can be further facilitated by applying a vacuum via port 69. Vacuum port 69 includes a path by which vacuum source 71 can be placed in fluid communication with main cavity 58, which is then sealed off either by use of a manual or automatic vacuum valve or chill vent. The magnitude of the applied vacuum varies depending on the alloy composition, thermal gradient, and solidification properties of the casting, but is frequently on the order of about 150 mm Hg (0.20 atm) to about 300 mm Hg (0.40 atm).

Die casting dies 50 can be reused several times before being retired and can be made from thermally conductive materials like the metal, ceramic, and metal matrix materials described above that are chemically inert to the casting alloy. In contrast, investment casting is a labor- and cost-intensive process where each ceramic casting mold must be individually produced around a wax pattern, both of which are destroyed in making each individual casting. This adds time, cost, and opportunity for error into each casting run. High temperature die casting apparatus 48 also allows for repeatable production of high quality castings, which reduces or eliminates the need for specialized casting molds and post-casting processing to remove defects, shrinkage, and porosity. During solidification, carbides, oxides, and other impurities precipitate out of molten metal. And in investment casting, ceramic pieces can also become dislodged from the inner die surface and become suspended in the casting. Excess impurities and dross such as this can result in defects and rejection during non-destructive inspection if solidified into the casting. Casting temperatures approaching or exceeding 1500° F. (815° C.) also greatly increases the frequency and severity of these problems as compared to lower temperature die castings.

However, in conjunction with careful localized temperature control such as through the use of chillers 66 and heat source 68, the metal above the solidification front can remain above the $\gamma/\gamma'$ solvus temperature, encouraging in situ zone refining along and ahead of the thermal gradient induced solidification front. High temperature die casting apparatus 48 and die casting die 50 thus eliminates the need for complex impurity filtering and removal systems as well as expensive ceramicless dies sometimes used in investment casting. Maintaining heat source 68 above the solidification front (generally corresponding to the longitudinal position of chillers 66) causes that portion of main cavity 58 to remain at an elevated temperature until just prior to solidification. This results in a high quality casting 30 having minimal impurities because they become more and more concentrated in the remaining molten alloy.

It will thus be recognized that casting die 50 can additionally or alternatively include an upper sacrificial region of main cavity 58 to capture and isolate the impurities and shrinkage from the useful portions of die casting 30. Supplemental cavities or other structures in communication with main cavity 58 can also be used in conjunction with grain selector 62 and chillers 66 to further reduce porosity, shrinkage, and defects in casting 30. The resulting sacrificial cast structures (not shown) can be recycled with the gating material. Suitable examples of structures and methods for segregating defects and shrinkage in a high-temperature die casting are described in commonly assigned U.S. patent application Ser. No. 13/173,602, filed on Jun. 30, 2011, which is herein incorporated by reference in its entirety.

Other structures also may be included in fluid communication with main cavity 58. For example, die casting die 50 can also be provided with cavity structures such as grain jumpers (not shown) intended to promote growth in the same direction as the remainder of the casting by providing a direct solidification path between the base of the casting and the upper detailed features. And as described above, there may be sacrificial structures built into die 50 to capture impurities, shrinkage, and other defects after solidification. These and other elements can be incorporated into die 50 in a manner similar to grain selector 62 and starter block 64.

Figure 4A:
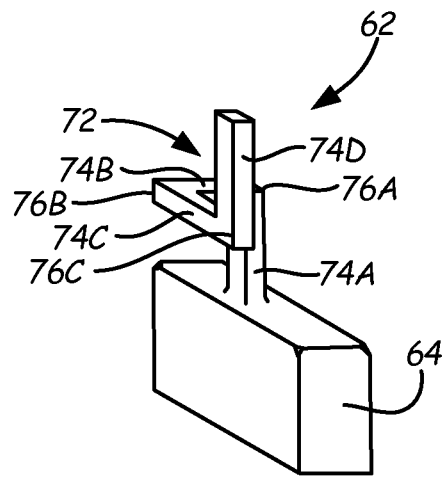
FIG. 4A is a magnified view of the grain selector in FIGS. 3A and 3B.

FIG. 4A shows grain selector 62 with starter block 64, helix 72, and helix legs 74A, 74B, 74C, 74D, and right angles 76A, 76B, 76C. As part of in-gate 60 shown in FIGS. 3A and 3B, grain selector 62 and starter block 64 are in fluid communication with main cavity 58 and shot sleeve 54. Here, grain selector 62 includes starter block 64 and helix 72, which can be described as a "two-dimensional pigtail".

Here, helix 72 is characterized by three relatively sharp 90° right angles 76A, 76B, 76C therebetween. A number of grains begin in starter block 64. As the localized thermal gradient proceeds in direction 70 (shown in FIGS. 3A and 3B) from block 64 and through each leg 74A, 74B, 74C, and 74D, the grains compete until only one remains prior to solidification beginning in main cavity 58. Legs 74A, 74B, 74C, 74D and angles 76A, 76B, 76C can be shaped and sized to induce grain growth as close as possible to the selected primary crystallographic orientation prior to the solidification front reaching main cavity 58 (shown in FIGS. 3A and 3B).

Figure 4B:
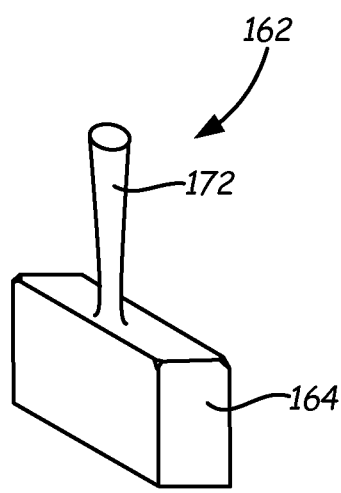
FIG. 4B shows an alternative embodiment of the grain selector shown in FIG. 4A.

FIG. 4B shows alternative grain selector 162 with starter block 164 and inchworm 172. Alternative grain selector 162 utilizes inchworm 172. In contrast to helix 72 in FIG. 4A, inchworm 172 tapers quickly inward adjacent starter block 164 to quickly narrow solidification to a single grain and then tapers again slowly outward as it approaches main cavity 58 (shown in FIGS. 3A and 3B). With certain alloys, the initial sharp tapering at the base of inchworm 172 is sufficient to terminate a number of competitive grains originating in block 164, which then causes a single crystal to form in inchworm 172 prior to the solidification front reaching main cavity 58 (shown in FIGS. 3A and 3B). Grain selector 162 can thus be used with alloys which normally solidify with large grains and relatively few boundaries.

It will be recognized that grain selector 62 or 162 can also have a more complex 3-D helical geometry integrated into die plates 56A, 56B. Though more difficult to form inside casting die 50, a more complex grain selector geometry is sometimes needed when other simpler geometries such as those in FIGS. 4A and 4B fail to consistently achieve the desired primary crystal orientation. In this example, grain selector 62 or 162 controls primary crystallographic orientation of the single crystal into main cavity 58. However, grain selectors 62, 162 may not provide sufficient control of secondary crystal orientations for certain applications.

Figure 5A:
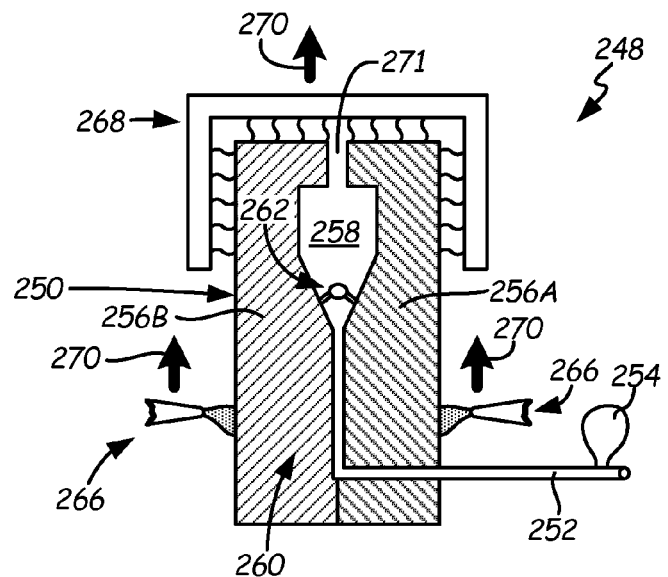
FIG. 5A shows an alternative high-temperature die casting apparatus using a seed.

FIG. 5A includes alternative die casting apparatus 248, die casting die 250, pressure chamber 252, shot sleeve 254, cover die plate 256A, ejector die plate 256B, main cavity 258, gating 260, seed crystal 262, chillers 266, heat source 268, thermal gradient direction 270, and vacuum port 271. FIG. 5A is an alternative embodiment of high temperature die casting apparatus 48 whereby both the primary and secondary crystalline orientations of die casting 30 (shown in FIG. 2) can be controlled. Most elements in die casting apparatus 248 are similar or identical to apparatus 48 shown in FIGS. 3A and 3B, except as described below. Seed crystal 262 is an alternative form of grain selector 62 configured to control both primary and secondary crystallographic orientations in a high temperature single crystal die casting. In this example, seed crystal 262 is a small single crystal of the casting alloy disposed at the base of main cavity 258 and aligned so as to promote the desired direction of crystal growth in main cavity 258. Thus as can be seen, seed crystal 262 takes the place of grain selector 62 and starter block 64 as compared to FIGS. 3A and 3B. As before, molten metal is injected into die 250 and the localized thermal gradient applied longitudinally in direction 270. Main cavity 258 is tapered upward from crystal 262 to maintain the crystal orientation throughout solidification, which can be controlled by application of chillers 266 and heat source(s) 268.

The examples above have primarily been described with respect to forming die casting 30 as a single crystal. Alternatively, in the absence of a grain selector 62 or seed crystal 262, inducing and directionally applying the localized thermal gradient to the molten metal in the die results in directional solidification in cavity 58, causing formation of a columnar grain die casting 30 with axially aligned grain boundaries.

Figure 5B:
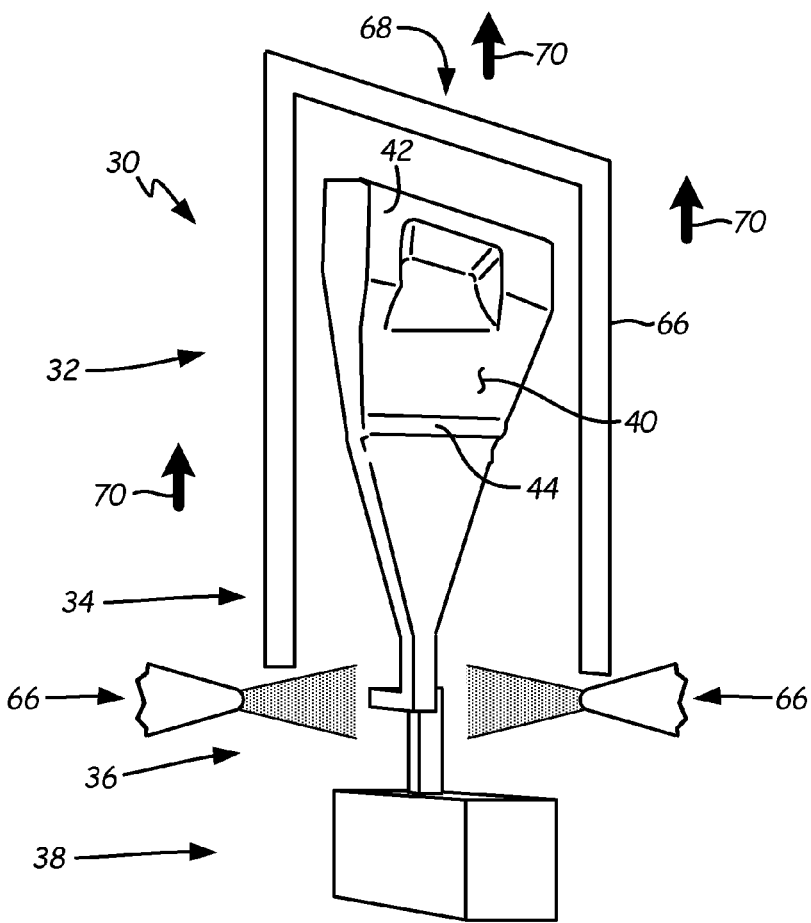
FIG. 5B shows application of a localized thermal gradient to a die casting after removal from a high temperature die casting apparatus.

FIG. 5B shows die casting 30, main casting section 32, gating 34, grain selector 36, starter block 38, airfoil section 40, tip section 42, root section 44, chiller 66, and heat source 68. Previous examples have been described wherein casting 30 was initially solidified via directionally applying a localized thermal gradient to the casting die in a combined solidification and zone refining process. This resulted in a single crystal or columnar grain die casting being formed inside the die. Alternatively, in FIG. 5B, casting 30 is removed from die casting die 50 before being additionally or alternatively subjected to one or more directional applications of a localized gradient via chillers 66 and heat source 68. In one example, casting 30 is first formed with columnar grains or a single crystal through use of the localized thermal gradient as described above. Casting 30 is then removed from die 50 and a second set of chillers 66 and heat source 68, which may in this example be respectively a fluid spray and induction furnace or any other suitable combination, are then used to control the thermal gradient directly in casting 30. Alternatively, casting 30 is equiaxially solidified apparatus 48 (in FIGS. 3A and 3B) without first directionally applying chillers 66 and heat source 68. The equiax casting is then removed and subsequently subjected one or more directional applications of a localized thermal gradient. Both cases result in zone refining of casting 30 at each pass, finally resulting in casting 30 being either a columnar grain or single crystal structure. This zone refining process, whether performed during initial solidification, post-casting, or both, reduces or eliminates the need for other more complex post-casting defect treatments such as hot isostatic processing (HIP).

To summarize examples of high-temperature die casting processes, the following steps can be performed. In both examples, molten metal is injected via an in-gate into a main cavity of a high temperature die casting die, which is then solidified by applying a thermal gradient to the die. In one case, the thermal gradient is localized to a portion of the die and is directionally applied along one dimension of the die to directionally solidify the casting while in the main cavity with a first grain orientation such as columnar grains. When the die casting die includes a grain selector or seed crystal, the localized thermal gradient can be longitudinally applied first through the starter block and then the grain selector. When the thermal gradient is then applied directionally through the die along the main cavity portion, a single-crystal casting is formed. Alternatively, a thermal gradient is not directionally applied during solidification resulting in an equiax casting in the die. In either case, after initial solidification, the die is opened and the casting ejected. The localized thermal gradient can then be directionally applied one or more times along the initial equiax, columnar grain, or single crystal casting.

The examples above have been described generally with respect to higher temperature iron-based, nickel-based, titanium-based, and cobalt-based alloys having melting points of at least about 1500° F. (about 815° C.). It will be recognized that traditional lower temperature casting alloys like magnesium-based, aluminum-based, and copper-based alloys can also be die cast in the above manners. While not typically used in the hot section of a gas turbine engine, such castings can have uses in aerospace or other fields without the need for maintaining separate die casting equipment. The method can additionally be adapted to die casting of high temperature alloys consisting of columnar grains or single crystals for any application.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A high-temperature die casting apparatus comprising:
   a die casting die including at least a first die plate and a second die plate defining a recess for receiving and solidifying molten metal into a metal casting, the recess including gating in fluid communication with a main cavity; and
   an in situ zone refining apparatus comprising:
      a chiller including at least a first fluid sprayer and a second fluid sprayer each movable in a first longitudinal direction relative to the die casting die, or vice versa, the first fluid sprayer directed toward a first lateral side of the die casting die and a second fluid sprayer directed toward a second opposing lateral side of the die casting die; and
      a heat source disposed ahead of the chiller and movable in the first longitudinal direction relative to the die casting die, or vice versa;
      wherein the heat source selectively cooperates with the chiller to directionally apply a localized thermal gradient through an exterior surface of at least one of the first and second die plates to the die casting die recess, the localized thermal gradient applied along the first longitudinal direction from the first end to the second end of the die casting die across at least the main cavity via relative movement of the in situ zone refining apparatus from the first end of the die casting die to the second end;
      wherein the localized thermal gradient induces a movable solidification front in the molten metal received in the main cavity such that the in situ zone refining apparatus is configured to maintain a portion of the metal above the solidification front above a γ/γ' solvus temperature of the metal as the localized thermal gradient is directionally applied.

2. The high-temperature die casting apparatus of claim 1, wherein the gating in the die casting die includes a grain selector.

3. The high-temperature die casting die apparatus of claim 1, wherein a grain selector configured as a seed crystal is disposed in the main cavity.

4. The high-temperature die casting die apparatus of claim 1, wherein the first die plate and the second die plate comprise an insulating material sufficient to allow the first and second die plates to maintain the portion of metal above the solidification front and ahead of the thermal gradient in a molten state, the molten metal having a melting temperature of at least 1500° F., and the insulating material selected from a group consisting of: a ceramic, a metal matrix composite, a ceramic matrix composite, a refractory metal, and combinations thereof.

5. The high-temperature die casting die apparatus of claim 4, wherein the first die plate and the second die plate further comprise at least one thermally conductive pathway extending through the insulating material, between the in situ zone refining apparatus and the recess, to maintain the solidification front, and while maintaining the portion of the metal above the solidification front above the γ/γ' solvus temperature of the metal.

6. A method of die casting a molten metal having a melting temperature of at least 1500° F. (815° C.), the method comprising the steps of:
   injecting the molten metal into gating and a main cavity of a die casting die, the main cavity and gating forming at least a part of a recess defined by at least a first die plate and a second die plate;
   operating an in situ zone refining apparatus to directionally apply a first localized thermal gradient to the molten metal through an exterior surface of at least one of the first and second die plates to the die casting die recess, the in situ zone refining apparatus and the die plates movable relative to each other so as to apply the first localized thermal gradient along a first longitudinal direction along the main cavity from a first end to a second end;
   wherein operating the in situ zone refining apparatus comprises:
      operating a chiller to direct a first fluid spray from a first fluid sprayer toward a first lateral side of the die casting die, and to direct a second fluid spray from a second fluid sprayer toward a second opposing lateral side of the die casting die, and moving the first and second fluid sprayers in the first longitudinal direction relative to the die casting die, or vice versa; and
      operating a heat source disposed ahead of the chiller, wherein the heat source is movable relative to the die casting die, or vice versa, the heat source selectively cooperating with the chiller such that the first localized thermal gradient is applied through the exterior surface of the at least one of the first and second die plates, and along the first longitudinal direction across at least the main cavity;
   wherein the step of directionally applying a first localized thermal gradient induces a movable solidification front in the molten metal disposed in the main part cavity such that a portion of the metal above the solidification front remains above a γ/γ' solvus temperature of the metal as the first localized thermal gradient is directionally applied, thereby solidifying the molten metal in the main part cavity to form a casting.

7. The method of claim 6, wherein the solidifying step comprises performing the first directional applying step on the molten metal injected into the die casting die to solidify the molten metal directly into a casting having a first grain orientation.

8. The method of claim 7, wherein a grain selector is disposed in the main part cavity or as part of the gating, and wherein the first directional applying step comprises first directionally applying the localized thermal gradient through a portion of the molten metal proximate the grain selector, and then through a remainder of the molten metal to solidify the molten metal directly into a single crystal.

9. The method of claim 8, further comprising:
removing the casting from the die casting die;
directionally applying a second localized thermal gradient directly in the casting, which results in zone refining of the casting.

10. The method of claim 6, wherein the metal has a predominant element selected from the group: iron, nickel, cobalt, and titanium.

11. The method of claim 10, wherein the metal has a predominant element of nickel.

* * * * *